United States Patent
Schmitt

(10) Patent No.: US 8,554,301 B2
(45) Date of Patent: Oct. 8, 2013

(54) MAGNETIC RESONANCE SYSTEM AND METHOD FOR OBTAINING MAGNETIC RESONANCE IMAGES OF A BODY REGION WITH A FLOWING MEDIUM THEREIN

(75) Inventor: Peter Schmitt, Weisendorf (DE)

(73) Assignee: Siemens Aktiengesellschaft, Munich (DE)

( * ) Notice: Subject to any disclaimer, the term of this patent is extended or adjusted under 35 U.S.C. 154(b) by 34 days.

(21) Appl. No.: 13/177,730

(22) Filed: Jul. 7, 2011

(65) Prior Publication Data

US 2012/0016224 A1    Jan. 19, 2012

(30) Foreign Application Priority Data

Jul. 16, 2010 (DE) .......................... 10 2010 027 312

(51) Int. Cl.
  *A61B 5/05* (2006.01)
  *G06K 9/00* (2006.01)
(52) U.S. Cl.
  USPC ............................ 600/410; 600/419; 382/131
(58) Field of Classification Search
  USPC ............ 600/410, 419; 382/128, 131; 324/309
  See application file for complete search history.

(56) References Cited

U.S. PATENT DOCUMENTS

| | | | | |
|---|---|---|---|---|
| 5,105,152 | A * | 4/1992 | Pauly | 324/309 |
| 2008/0269595 | A1 | 10/2008 | Wong | |
| 2010/0141252 | A1* | 6/2010 | Fautz et al. | 324/307 |
| 2010/0164496 | A1* | 7/2010 | Briggs et al. | 324/309 |

OTHER PUBLICATIONS

Setsompop et al., "Parallel RF Transmission With Eight Channels at 3 Tesla", Magn. Reson. Med., vol. 56 (5) (2008), pp. 1163-1171.
Meyer et al., "Simultaneous Spatial and Spectral Selective Excitation", Magn. Reson. Med., vol. 15 (1990), pp. 287-304.
Grissom et al., "Additive Angle Method for Fast Large-Tip-Angle RF Pulse Design in Parallel Excitation", Magnetic Resonance in Medicine, vol. 59 (2008), pp. 779-787.
Dan Xu et al., Designing Multichannel, Multidimensional, Arbitrary Flip Angle RF Pulses Using an Optimal Control Approach, Magnetic Resonance in Medicine, vol. 59 (2008), pp. 547-560.
Yamashita et al., "Selective visualization of renal artery using SSFP with Time-Spatial Labeling Inversion Pulse: Non-Contrast Enhanced MRA for patients with renal failure", Proc. Intl. Soc. Mag. Reson. Med., vol. 13 (2005), p. 1715.
Pauly et al., "Echo-Planar Spin-Echo and Inversion Pulses", MRM, vol. 29 (1993), pp. 776-782.

(Continued)

*Primary Examiner* — Long V. Le
*Assistant Examiner* — Katherine Fernandez
(74) *Attorney, Agent, or Firm* — Schiff Hardin LLP

(57) ABSTRACT

A method to create magnetic resonance images of a predetermined imaging volume within an examination subject with a magnetic resonance system includes the following steps: Localize an inflow that supplies the imaging volume. Form a specific volume that at least partially includes the predetermined imaging volume and that is adapted to the inflow such that the specific volume has a recess into the specific volume at the inflow, via which recess at least a partial segment of the inflow is removed from the specific volume. Saturate or invert the magnetization of the specific volume by means of the magnetic resonance system. Detect measurement signals from the imaging volume. Create the MR images of the imaging volume by means of the measurement signals.

15 Claims, 7 Drawing Sheets

(56) References Cited

OTHER PUBLICATIONS

Pauly et al., "A Linear Class of Large-Tip-Angle-Selective Excitation Pulses", Journal of Magnetic Resonance, vol. 82 (1989), pp. 571-587.
Setsompop et al., "High-Flip-Angle slice-selective parallel RF transmission with 8 channels at 7 Tesla", J. Magn. Reson., vol. 195 (1) (2008), pp. 76-84.
Katoh et al., "Free-breathing renal MR angiography with steady-state free-precession (SSFP) and Slab-selective spin inversion: Initial results", Kidney International, vol. 66 (2004), pp. 1272-1278.
Pauly et al., "A k-space analysis of small-tip angle excitation", J. Magn. Reson., vol. 81 (1989), pp. 43-56.
Conolly et al., "Two-Dimensional Selective Adiabatic Pulses", Magnetic Resonance in Medicine, vol. 24 (1992), pp. 302-313.
He et al., "Application of Variable-Rate Selective Excitation Pulses for Spin Labeling in Perfusion MRI", Magn. Reson. Med., vol. 63 (2010), pp. 842-847.
Davies et al., "Selective Arterial Spin Labeling (SASL): Perfusion Territory Mapping of Selected Feeding Arteries Tagged Using Two-Dimensional Radiofrequency Pulses", Magn. Reson. Med., vol. 49 (2003), pp. 1133-1142.
Holm et al., "Slice profile optimization in arterial spin labeling using presaturation and optimized RF pulses", Magn. Reson. Imag., vol. 24 (2006), pp. 1229-1240.
Katscher et al., "Parallel RF transmission in MRI", NMR Biomed., vol. 3 (2006), pp. 393-400.

\* cited by examiner

FIG 2
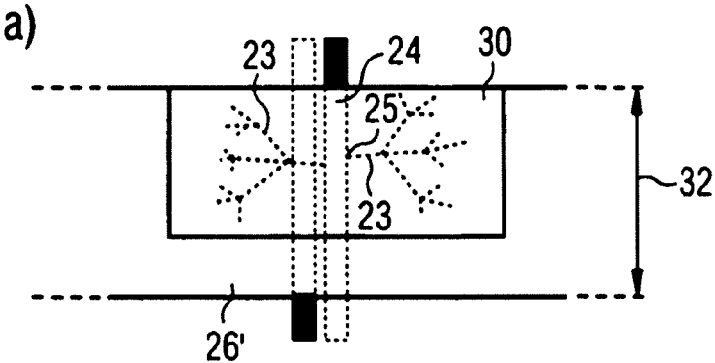
a)
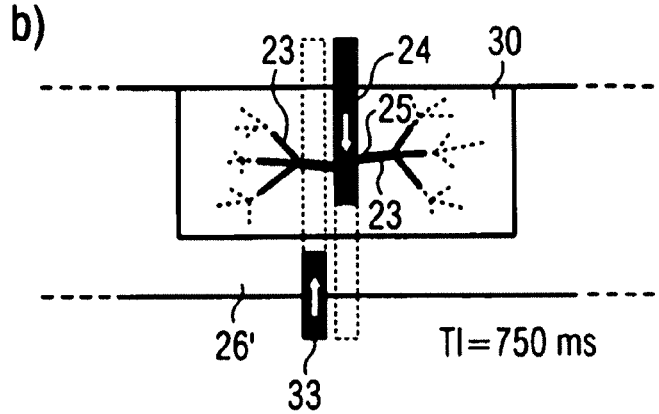
b) TI=750 ms
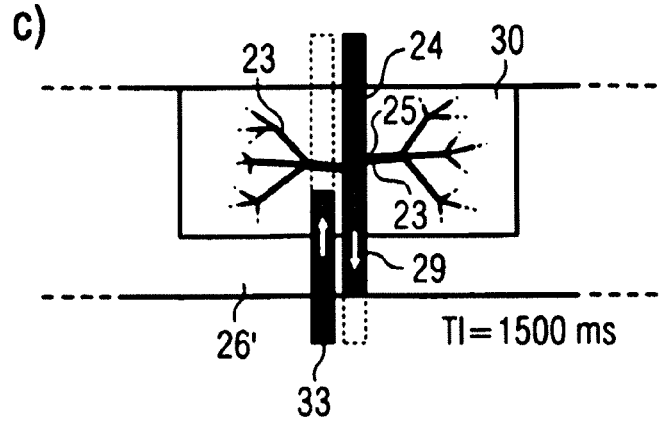
c) TI=1500 ms

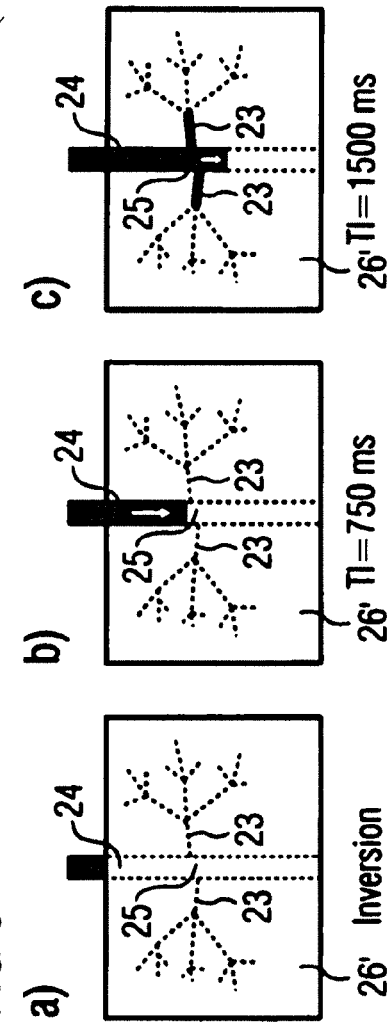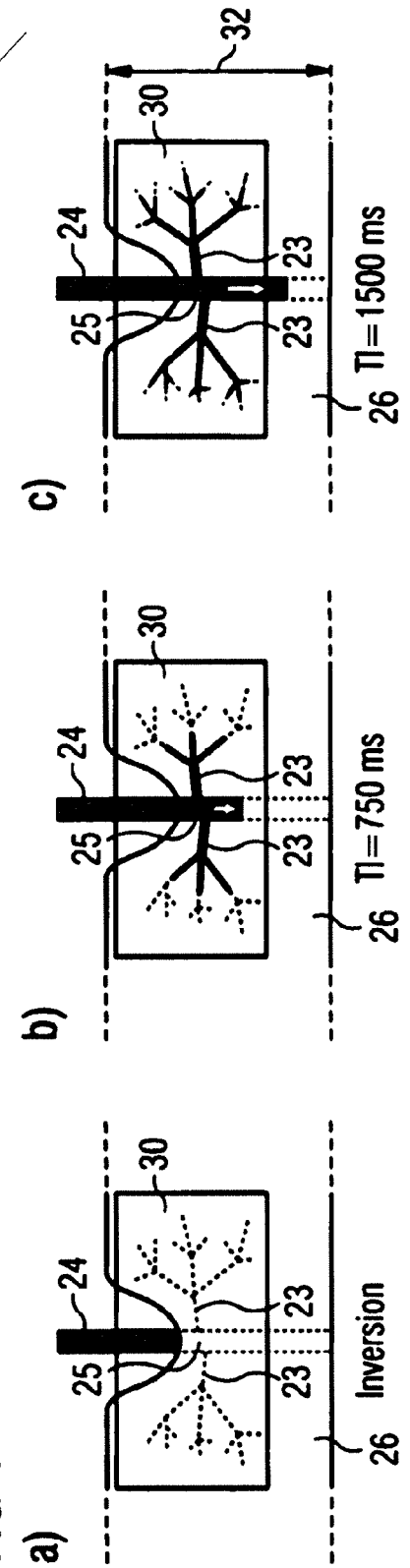

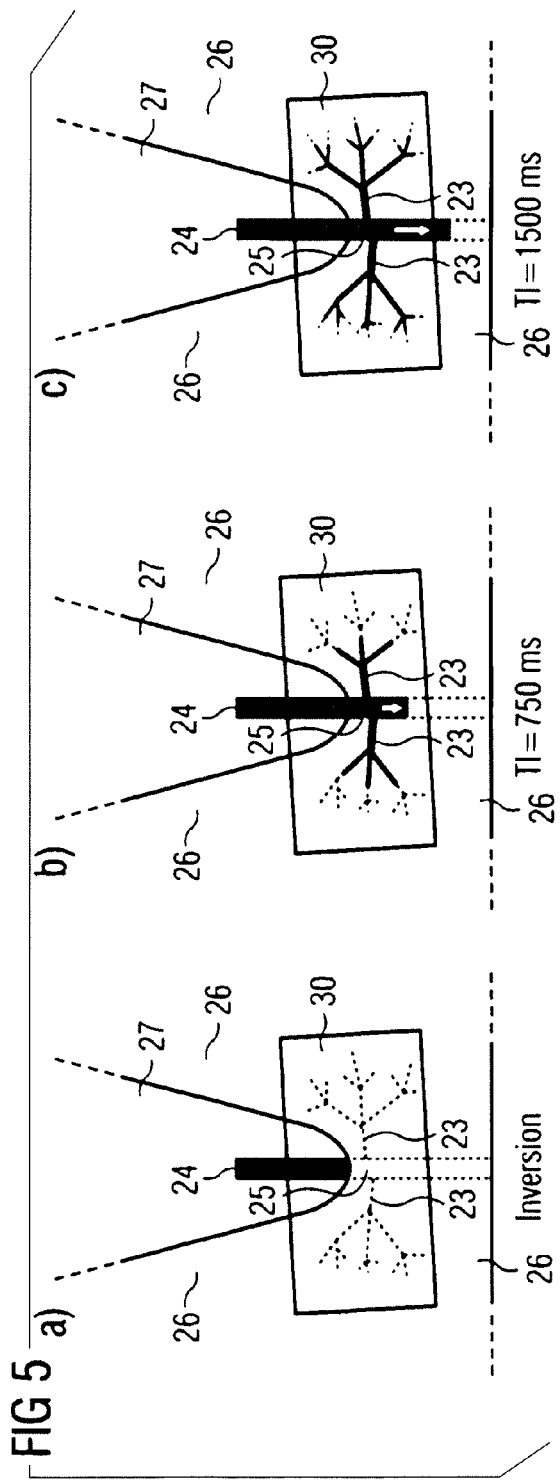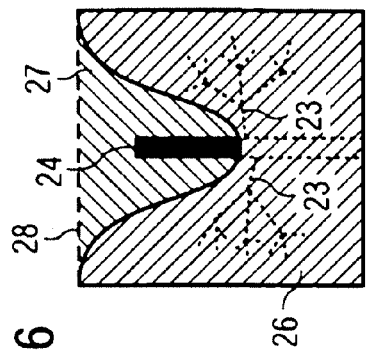

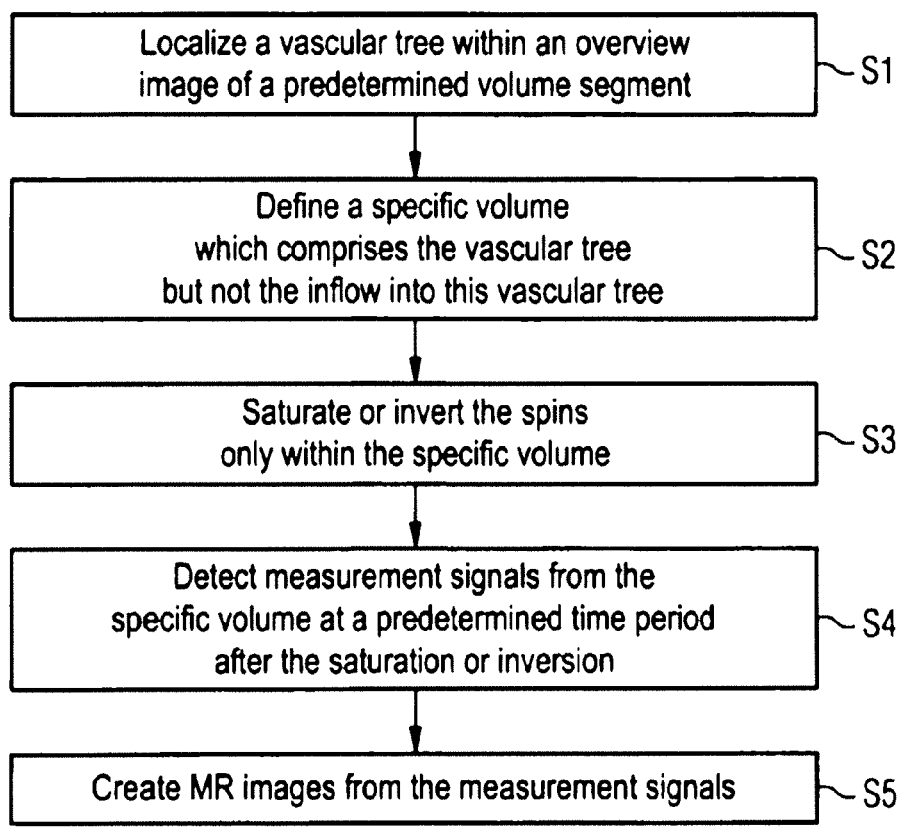

MAGNETIC RESONANCE SYSTEM AND METHOD FOR OBTAINING MAGNETIC RESONANCE IMAGES OF A BODY REGION WITH A FLOWING MEDIUM THEREIN

BACKGROUND OF THE INVENTION

1. Field of the Invention

The present invention concerns a method to create magnetic resonance (MR) images (in particular in the field of MR angiography and for the presentation of perfusion information) and a magnetic resonance system designed to implement this method, as well as a corresponding non-transitory computer data storage medium.

2. Description of the Prior Art

In MR angiography operating without contrast agent it is known to operate with spin labeling (a marking of the spin). For this purpose, a slice-shaped volume (i.e. a volume bounded in a single spatial dimension) that contains the vessels of interest is normally marked with the use of a slice-selective inversion band. From a geometric standpoint, the slice-shaped volume or the slice has two flat, uncurved planes that are parallel to one another as boundary surfaces. A slice is excited with a conventional frequency-selective RF pulse with a constant magnetic field gradient. This means that a lateral boundary does not exist in addition to the boundary surfaces (boundary planes) of the slice. However, in practice the examination subject (the patient) or an imaging volume of the magnetic resonance system is finite, such that the slice-shaped volume also has a lateral boundary somewhere.

Measurement signals are acquired after the inversion time (TI "Inversion Time") and are translated into corresponding MR angiography images. The spins within the volume ideally yield no signal (or at least only a weak a signal) while fluids (blood, for example) flowing into the vessels from outside the volume generate a relatively high signal strength; see for example "Free-breathing renal MR angiography with steady-state free-precession (SSFP) and slab-selective inversion: initial results"; M. Katoh et al.; Kidney Int. 2004; 66(3); Pages 1272-1278 and "Selective visualization of renal artery using SSFP with Time-Spatial Labeling Inversion Pulse Non-Contrast Enhanced MRA for patients with renal failure"; Y. Yamashita et al.; Proc. Intl. Soc. Mag. Reson. Med. 13 (2005), Page 1715.

However, for patients with a low cardiac output or for regions with a slow blood flow, it is difficult to sufficiently fill the vascular tree of interest with fresh, unsaturated incoming blood, in particular given a short TI. Those parts of the vascular tree that are not reached by the fresh, unsaturated, incoming blood disadvantageously remain dark in the resulting MR angiography images. That blood that flows into the vascular tree from the inverted, slice-shaped volume generates no or nearly no signal due to the preceding inversion of its spins, and therefore shortens the length of the visible portion of the vascular tree within the MR angiography images.

The fact that inverted or saturated blood generates nearly no signal can also be used advantageously. For example, in the abdominal region a volume is typically inverted that travels well beyond the imaging volume in the caudal direction (in the direction of the feet). Venous blood that flows into the imaging volume thus is also inverted and (as is most often desired) suppressed. However, the described effect is unwanted with regard to the arterial blood that flows into the vascular tree to be examined. In order to minimize the problem, according to the prior art (for example) the boundary surface of the inversion slice is placed optimally close to (flush with) the vascular tree to be examined in the direction from which the blood flows.

Nevertheless, the problem is sometimes disruptive, in particular in an examination of the renal arteries with MR angiography images, wherein the slice-shaped inversion volume has to include both kidneys. Since both kidneys are situated in the slice-shaped inversion volumes, a situation inevitably arises that a significant quantity of the arterial blood "disappears" in the aorta, since this blood is located within the inversion volume (as is shown in illustrations (a), (b) and (c) in FIG. 2).

In illustration (a) in FIG. 2 a point in time is shown shortly after the spins within the inversion volume 26' have been inverted. It is apparent in illustration (a) in FIG. 2a that the slice thickness 32 of the inversion volume 26' is greater than the slice thickness of the imaging volume 30 (which also applies for the other illustrations in FIG. 2, as well as the illustrations in FIGS. 3 and 4).

The situation of an inversion time (TI) of 750 ms after the inversion is shown in illustration (b) in FIG. 2. Within this 750 ms, in a healthy patient (with normal cardiac output) a large amount of blood has already flowed from outside the inversion volume 26' into the section of the aorta 29 that is located within the inversion volume 26', and therefore also into the vascular tree 23, such that in the case of the acquisition of an MR angiography image the corresponding portion of the vascular tree 23 is visible (in black) in illustration (b) in FIG. 2.

If the MR angiography image is only acquired 1500 ms after the inversion (as is shown in illustration (c) in FIG. 2), for a healthy patient nearly the entire vascular tree 23 is visible. It also occurs that a subset of the blood that has flowed in has then flowed out of the imaging volume 30 again, as is the case in the lower section of the aorta 29 in illustration (c) in FIG. 2.

The venous blood supply 33 is also shown in illustrations (a), (b) and (c) in FIG. 2. By selecting the distance between the lower (in FIG. 2) boundary surface of the inversion volume 26' and the lower edge of the vascular tree 23 (the lower boundary surface of the imaging volume 30) is to be relatively large, nearly no venous, unsaturated blood flows into the imaging volume 30 even given an inversion time of 1500 ms.

With reference to illustration (a), (b) and (c) in FIG. 2, it is noted that for many medical questions the visibility of the vascular tree 23 beginning at the ostium 25 (i.e. the point at which the vascular tree 23 branches away from the aorta) up to the peripheral branchings plays a significantly more important role than the visibility of the aorta 29 itself.

While the vascular tree 23 is clearly visible at least at an inversion time of 1500 ms for a patient with normal cardiac output, according to the prior art this can not be the case for a patient with low cardiac output (as is shown as an example in illustrations (a), (b) and (c) in FIG. 3). Due to the lower cardiac output, in illustration (b) in FIG. 3 (TI=750 ms), the unsaturated blood has still not even flowed up to the ostium 25. Although the unsaturated blood has also flowed into the forward section of the vascular tree 23 in illustration (c) in FIG. 3 (TI=1500 ms), it has not yet flowed into the peripheral branches, causing these to be nearly invisible in the MR angiography image represented by illustration (c) in FIG. 3.

In order to ensure the visibility of (optimally) the entire vascular tree (up to the peripheral branchings), even in patients with a low cardiac capacity, according to the prior art an optimally large inversion time (TI) is used in addition to the arrangement described above of the boundary surface of the inversion slice being optimally close to the vascular tree to be examined. However, this procedure has disadvantages. For long inversion times with a correspondingly low cardiac output, it frequently occurs that at least the peripheral branchings are not visible in the MR angiography images. Moreover, an extension of the inversion time (TI) inevitably leads to a long pulse sequence repetition (TR; "Time to Repetition") in order to ensure a sufficient elimination of the background signals. However, even given a very long repetition time (TR), the background signals can no longer be optimally suppressed given a long inversion time, such that the quality of the generated MR angiography images suffers.

SUMMARY OF THE INVENTION

An object of the present invention to improve the quality of MR images (in particular of MR angiography images) compared to the prior art, and in particular for patients with a low cardiac output.

Within the scope of the present invention, a method is provided to create MR images of a predetermined imaging volume within an examination subject (a patient) by means of a magnetic resonance system. The method according to the invention includes the following steps:

An anatomical inflow structure (inflow) is localized, via which the imaging volume or a partial volume (for example a vascular tree) within the imaging volume is supplied with blood (for example). For example, this localization can be conducted with an overview image which is created from the patient (or at least a volume segment of the patient in which the predetermined imaging volume is situated) by means of the magnetic resonance system. The localization can take place manually or even automatically.

A specific volume that includes the predetermined imaging volume is determined or formed. At the point at which the inflow is located, the specific volume has an incision or a recess (a cut-out or a hole) within said specific volume, whereby at least a portion of this inflow is extracted from the specific volume. Due to this incision or due to this recess, the specific volume does not have the volume of a cuboid or a thick slice. (In the sense of the present invention, a cuboid with a recess does not have a cuboid volume, even if it is situated within the cuboid and is not externally visible.) The specific volume preferably includes the predetermined imaging volume except for the incision or the recess.

For example, the specific volume can be formed starting from an arbitrarily shaped starting volume that includes comprises the imaging volume. From this starting volume an additional volume or volume to be excised is removed that includes the inflow up to a branching point of a vascular segment within the imaging volume. The specific volume accordingly results from the initial volume minus the volume to be excised.

According to a special variant, the special volume can also be formed starting from a slice-shaped initial volume that includes the imaging volume. A partial volume is excised from this initial volume from the bounding plane (boundary plane or boundary surface) of the initial volume at that point at which the inflow is situated at a vascular segment within the imaging volume, such that at least a partial segment of the inflow which is situated within this partial volume is no longer a component of the specific volume. The specific volume is thereby defined as a difference between the initial volume and the partial volume. In other words, according to this example the specific volume is not slice-shaped. This means that, according to this example, the specific volume is not bounded by two flat, uncurved planes parallel to one another.

Only the magnetization of the specific volume is saturated or inverted by means of the magnetic resonance system. This means that, according to this step, only the magnetization of the specific volume is inverted or saturated. Other volumes outside of the specific volume can also be inverted or saturated in the meanwhile during the implementation of this step.

Measurement signals from the imaging volume are subsequently acquired by means of the magnetic resonance system.

To acquire the measurement signals, a slice-shaped volume is normally excited which is typically not bounded in directions perpendicular to the slice thickness. However, due to the phase coding that is most often used in a direction perpendicular to the slice thickness, only a portion (which corresponds to the imaging volume) of the excited volume is detected with the acquired measurement signals. In other words, the imaging volume normally includes the non-inverted, excised partial volume although the background signal interferes in this partial volume. The imaging volume or measurement volume, however, does not necessarily encompass the entire specific volume since it is sometimes advantageous to form the specific volume to be inverted so as to be larger than the imaging volume (for example to suppress venous blood; see above).

MR images (for example MR exposures containing MR angiography images or perfusion information) of the predetermined imaging volume are created depending on these measurement signals.

It is noted that the imaging volume can be acquired or scanned two-dimensionally (spatial coding in two directions) or three-dimensionally (spatial coding in three directions). In the case of the two-dimensional acquisition the imaging volume is scanned with multiple slices. The specific volume is inverted or saturated before measurement signals of one of these slices are acquired. In the case of the three-dimensional acquisition of the imaging volume, the imaging volume can be scanned as one three-dimensional measurement volume or as multiple three-dimensional measurement volumes. The specific volume is also thereby inverted or saturated before measurement signals of a three-dimensional measurement volume are detected.

In the creation of MR images of blood vessels it is advantageous if the measurement signals are respectively acquired in the diastole so that the amount of blood in the vessels changes as little as possible per inversion or saturation during the acquisition of the measurement signals.

Because the specific volume in which the magnetization is saturated or inverted is specifically adapted to the conditions of the predetermined vascular segment to be examined, the amount of fluid (amount of blood) flowing from the specific volume into the vascular segment after the inversion or saturation can advantageously be reduced relative to the prior art. The quantity of unsaturated fluid (blood) that flows into the vascular segment after the inversion or saturation advantageously increases. In comparison to the prior art a larger proportion of the vascular segment will be visible in the MR angiography images to be created.

In other words, the boundary surface of the specific volume is tailored to the vascular segment and is advantageously placed as close as possible to the vascular segment of interest. Although the vascular segment of interest is completely inverted or saturated, an inversion or saturation of the fluid (the blood) in the neighborhood of the vascular segment is minimized.

Also, the present invention offers advantages relative to the prior art with regard to the generation of MR images which comprise perfusion information. In that the inflow of the fluid (in particular blood) from the volume to be inverted or to be saturated is optimally excised as much as possible, more fresh or unsaturated fluid advantageously exists in the volume segment of interest (in which the perfusion information is determined) during the acquisition of the measurement signals to acquire said perfusion information, or, respectively, the arrival time ("transit time") of the fluid for a specific voxel in this volume segment is reduced.

According to one embodiment according to the invention, the inversion of the specific volume is technically achieved in that a spatially non-selective inversion of a total volume which comprises the specific volume and the volume to be excised is combined with a spatially selective inversion of the volume to be excised. The volume to be excised, from which fluid flows into the specific volume, is therefore inverted twice, so the magnetization in the volume to be excised is shifted back into the initial state (before the non-selective inversion and the selective inversion) again. Only the magnetization of the specific volume is inverted, so the specific volume can encompass nearly everything that lies outside of the volume to be excised. (The non-selective inversion naturally acts only within the magnetic resonance system or, respectively, in the region of influence of the transmission coil, whereby the specific volume is technically bounded.)

According to one embodiment according to the invention, the inversion of the specific volume is implemented in that the spins within the specific volume are tilted with a frequency-selective RF pulse by 180° relative to the basic magnetic field of the magnetic resonance system. A possibly present residual transversal magnetization of the spins is subsequently dephased with a spoiler gradient pulse, and the measurement signals measure an inversion time (TI) after the RF pulse.

According to another embodiment according to the invention, the magnetization of the specific volume is saturated in that the spins within the specific volume are tilted with a frequency-selective RF pulse by 90° relative to the basic magnetic field. The residual transverse magnetization of the spins is subsequently dephased with a spoiler gradient pulse, and the measurement signals are acquired at a specific time period after the spoiler gradient pulse.

In other words, the magnetization of the specific volume is in particular inverted or saturated in that a frequency-selective RF pulse is radiated via which magnetization portions (spins) which are found at defined resonance frequencies (the spins precess with this frequency) are tilted away from the z-axis (direction of the basic magnetic field). Together with a slice-selective gradient (which is constant in the simple case) which generates a spatially linear curve of resonance frequencies in the predetermined volume segment during the radiation of the RF pulse, only one slice of the predetermined volume segment is therefore selectively excited. The remaining transverse magnetization can be dephased (and therefore destroyed) by means of a subsequent spoiler gradient. If a tilting of the magnetization by 180° is brought about due to the amplitude of the RF pulse it is called an inversion, while a tilting by 90° with subsequent spoiler gradient is called a saturation.

Adiabatic pulses represent a particular group of RF pulses; see "Selective spin inversion in nuclear magnetic resonance and coherent optics through an exact solution of the Bloch-Riccati equation", M. S. Silver et al.; Phys. Rev. A 31, Pages 2753-2755, 1985.

One example from this group is the hyperbolic secant pulse in which—in contrast to normal RF excitation pulses—not only the amplitude but also the frequency changes. Via such an RF pulse a highly-selective inversion can be achieved whose development is dependent on the amplitude of the RF pulse insofar as this amplitude is greater than a predetermined threshold. In other words, a tilting beyond 180° is not possible with this RF pulse, such that the inversion is very precisely achieved (i.e. the spins are tilted by exactly 180°).

In order to saturate or to invert only the specific volume (and not a slice-shaped volume) with RF pulses and gradients, according to one embodiment according to the invention a time-variable gradient curve and associated RF pulse curve (which RF pulse curve is then used to saturate or invert the specific volume) is calculated by means of a Fourier analysis, starting from the specific volume. While according to the prior art a temporally constant (and spatially varying) gradient field is thus switched during the RF excitation, according to the invention the gradients also vary over time (and not only over space) during the excitation.

According to this embodiment, the excitation volume (i.e. the specific volume) can be bounded in two dimensions by the gradient curve (defined by means of the Fourier analysis) and associated RF pulse curve. The underlying approach has a certain analogy to the generation of an MR image: a trajectory in k-space is essentially scanned via the application of a temporally variable magnetic field gradient. A switching of one long or multiple shorter successive RF pulses represents a weighting along this trajectory. The resulting excitation profile (i.e. the specific volume) results from the Fourier transformation of weighted k-space. The required RF and gradient curves can be generated from the desired excitation profile by means of a Fourier analysis, as has already been described in the preceding. Various trajectory curves are thereby conceivable in order to cover or scan k-space. Typical variants of these curves comprise spiral-shaped and echoplanar-like curves. A two-dimensional selective inversion or saturation of the specific volume can also take place by means of RF pulses of an adiabatic nature or on the basis of an echoplanar trajectory. With regard to this embodiment and its variants, the following documents can be referenced:

"Two-dimensional selective adiabatic pulses"; S. Conolly et al.; Magn. Reson. Med. 24; Pages 302-313; 1992.

"Simultaneous spatial and spectral selective excitation"; C. H. Meyer et al.; Magn. Reson. Med. 15; Pages 287-304; 1990.

"A k-space analysis of small-tip angle excitation"; J. M. Pauly et al.; J. Magn. Reson. 81; Pages 43-56; 1989.

"A linear class of large-tip-angle selective excitation pulses"; J. M. Pauly et al.; J. Magn. Reson. 82; Pages 571-587; 1989.

"Echo-planar spin-echo and inversion pulses"; J. M. Pauly et al.; Magn. Reson. Med. 29; Pages 776-782; 1993.

With regard to the aforementioned documents of the prior art it is mentioned that the excitation volumes described there have exclusively convex shapes, i.e. outwardly curved shapes, for example circles, ellipses or rectangles with rounded corners. In contrast to this, in the present invention the specific volume is in particular fashioned with a locally concave shape, i.e. with a boundary curved inward at least at one point. In other words, according to the invention a large volume should be inverted or saturated, wherein at the same time a small (for example funnel- or groove-shaped) volume in proximity to a boundary surface of the large volume is to be omitted with regard to the inversion or saturation, which is not the case according to the prior art.

The saturation or inversion of the specific volume can thereby be implemented in that multiple RF transmission pulses simultaneously generate RF pulses at different spatial positions. The acquisition of the measurement signals is thereby independent of whether the RF pulses are generated with one or multiple RF transmission pulses. In other words, the measurement signals can be detected with a receiver coil or even with multiple receiver coils.

By the use of parallel transmit methods (simultaneous use of multiple RF transmission coils) there is a better capability to excite only the specific volume. In contrast to this, given the use of only one RF transmission coil (as is typical according to the prior art) it is significantly more difficult to excite only the desired specific volume.

The following documents are referenced for additional information on this topic:
"Parallel MRF transmission in MRI", U. Katscher et al.; NMR Biomed. May 2006; 19(3) Pages 393-400.
"Additive angle method for fast large-tip-angle RF pulse design in parallel excitation"; W. A. Grisson et al.; Magn. Reson. Med.; 59(4); Pages 779-787; 2008.
"Parallel RF transmission with eight channels at 3 Tesla"; K. Setsompop et al.; Magn. Reson. Med.; 56(5); Pages 1163-1171; 2006.
"High-flip-angle slice-selective parallel RF transmission with 8 channels at 7 T"; K. Setsompop et al.; Magn. Reson. Med. 195(1); Pages 76-84; 2008.
"Designing multichannel, multidimensional, arbitrary flip angle RF pulses using an optimal control approach"; D. Xu et al.; Magn. Reson. Med. 59(3); Pages 547-560; 2008.

The present invention can moreover also be used in order to implement a perfusion measurement within the imaging volume (for example within the vascular segment).

Since, with the present invention, the quantity of unsaturated fluid which flows through a defined part of the predetermined imaging volume (in particular through the vessels of the vascular segment) is advantageously increased relative to the prior art, results of a perfusion measurement with better quality than is typical according to the prior art can be achieved. A perfusion measurement is a measurement in which tissue signals are acquired which deliver information about a fluid supply (for example perfusion) of the tissue at the capillary level. In other words, with the perfusion measurement a measure is determined with which a defined part of the tissue is supplied with fluid (blood).

Moreover, according to an embodiment according to the invention the MR images created according to the invention can be post-processed by means of MIP ("Maximum Intensity Projection") in order to generate MR images (for example MR angiography images) which depict information from a large volume at a glance, depending on a specific viewing angle.

According to this embodiment, the MR images are post-processed by means of MIP such that different views can be created interactively or automatically. According to MIP, from a three-dimensional data set a two-dimensional projection image is generated which represents the three-dimensional data set from a specific viewing direction. For each pixel (image point) of the two-dimensional target matrix, a "light ray" is thereby virtually constructed through the three-dimensional data set, which "light ray" stands perpendicular to the plane of the projection image. The highest signal intensity along this ray (i.e. the highest signal intensity of the pixels lying on this ray) is thereby respectively associated with the pixel of the two-dimensional target matrix. In practice this operation is connected with interpolations at "grid points" of the three-dimensional data set, at least for diagonal viewing directions. According to MIP, each pixel of an MIP image represents the highest intensity along the line of sight through data set.

Within the scope of the present invention, a magnetic resonance system is also prepared to create MR images of a predetermined imaging volume in an examination subject. The magnetic resonance system includes a basic field magnet; a gradient field system; at least one RF antenna; and a control device to activate the gradient field system and the at least one RF antenna, to receive measurement signals acquired by the RF antenna or antennas, and to evaluate the measurement signals and to create the MR images. The magnetic resonance system is designed such that an inflow which supplies the predetermined imaging volume or a portion of the imaging volume with fluid can be localized. Depending on this inflow, by means of the magnetic resonance system a specific volume that at least partially includes the predetermined imaging volume is defined such that the specific volume has an incision in the specific volume given the inflow, through which incision at least a portion of inflow is removed from the specific volume. The magnetic resonance system saturates or inverts the magnetization only within the specific volume and detects the measurement signals from the imaging volume from which the magnetic resonance system creates the MR images.

The advantages of the magnetic resonance system according to the invention essentially correspond to the advantages of the method according to the invention that have been described in detail above.

Furthermore, the present invention encompasses a non-transitory, computer-readable storage medium encoded with programming instructions, (a computer program or software) that can be loaded into a memory of a programmable controller or a computer of a magnetic resonance system. All or various embodiments of the method according to the invention that are described above can be executed with the programming instructions when run in the controller or control device of the magnetic resonance system. The programming instructions may possibly require auxiliary items (for example libraries and auxiliary functions) in order to realize corresponding embodiments of the method. The programming instructions can be in source code (for example C++) that must still be compiled (translated) and linked or that only must be interpreted, or can be an executable software code that is only to be loaded into the corresponding computer for execution.

The electronically readable data storage medium can be, for example a DVD, a magnetic tape or a USB stick on which is stored electronically readable control information, in particular software (see above).

The method according to the invention can be combined with a three-dimensional b-SSFP (TrueFISP) measurement method or with a gradient echo measurement method after the inversion time (TI). (FISP="Fast Imaging with Steady State Precession"; b-SSFP="balanced Steady State Free Precession")

However, it is also possible for the method according to the invention to be combined with multi-echo measurement method (TSE or EPI) after the inversion time (TI). (TSE="Turbo Spin Echo"; EPI="Echo Planar Imaging")

To implement the measurement method, Cartesian, radial, cylindrical or spiral-shaped trajectories can be scanned in k-space. The radial scanning variant "Stack of Stars" in which the trajectories appear as a stack (in the z-direction) of stars situated in the xy-plane is also possible.

The method according to the invention can be used for MR angiography in the abdomen to examine the vascular system of the kidneys or liver. Moreover, the method according to the invention can be used for perfusion measurement.

To define or determine the specific volume, according to the invention a program can be used which comprises an interface via which an operator can graphically position and shape the specific volume, for example depending on the vascular system to be examined or on the corresponding inflow.

Moreover, it is possible to use an algorithm which creates the specific volume automatically or semi-automatically (for example depending on the vascular system to be examined) in order to define or determine the specific volume.

The present invention is particularly suitable in order to improve the quality of MR angiography images, in particular in patients with low cardiac output. The present invention is naturally not limited to this preferred application field since the present invention improves results of an MR angiography in the general case as well (independent of the cardiac output of the patient) and can also be used to determine perfusion information.

BRIEF DESCRIPTION OF THE DRAWINGS

FIG. 2 schematically illustrates states of the blood flow at the point in time of the inversion and at later points in time for a patient with normal cardiac output according to the prior art.

FIG. 3 schematically illustrates states of the blood flow at the point in time of the inversion and at later points in time for a patient with low cardiac output according to the prior art.

FIG. 4 schematically illustrates states of the blood flow at the point in time of the inversion and at later points in time for a patient with low cardiac output according to one embodiment of the present invention.

FIG. 5 schematically illustrates states of the blood flow at the point in time of the inversion and at later points in time for a patient with low cardiac output according to an additional embodiment of the present invention.

FIG. 6 shown an example of the formation of the specific volume according to the invention.

FIG. 10 is a flow chart of an embodiment of the method according to the invention.

DESCRIPTION OF THE PREFERRED EMBODIMENTS

Figure 1:
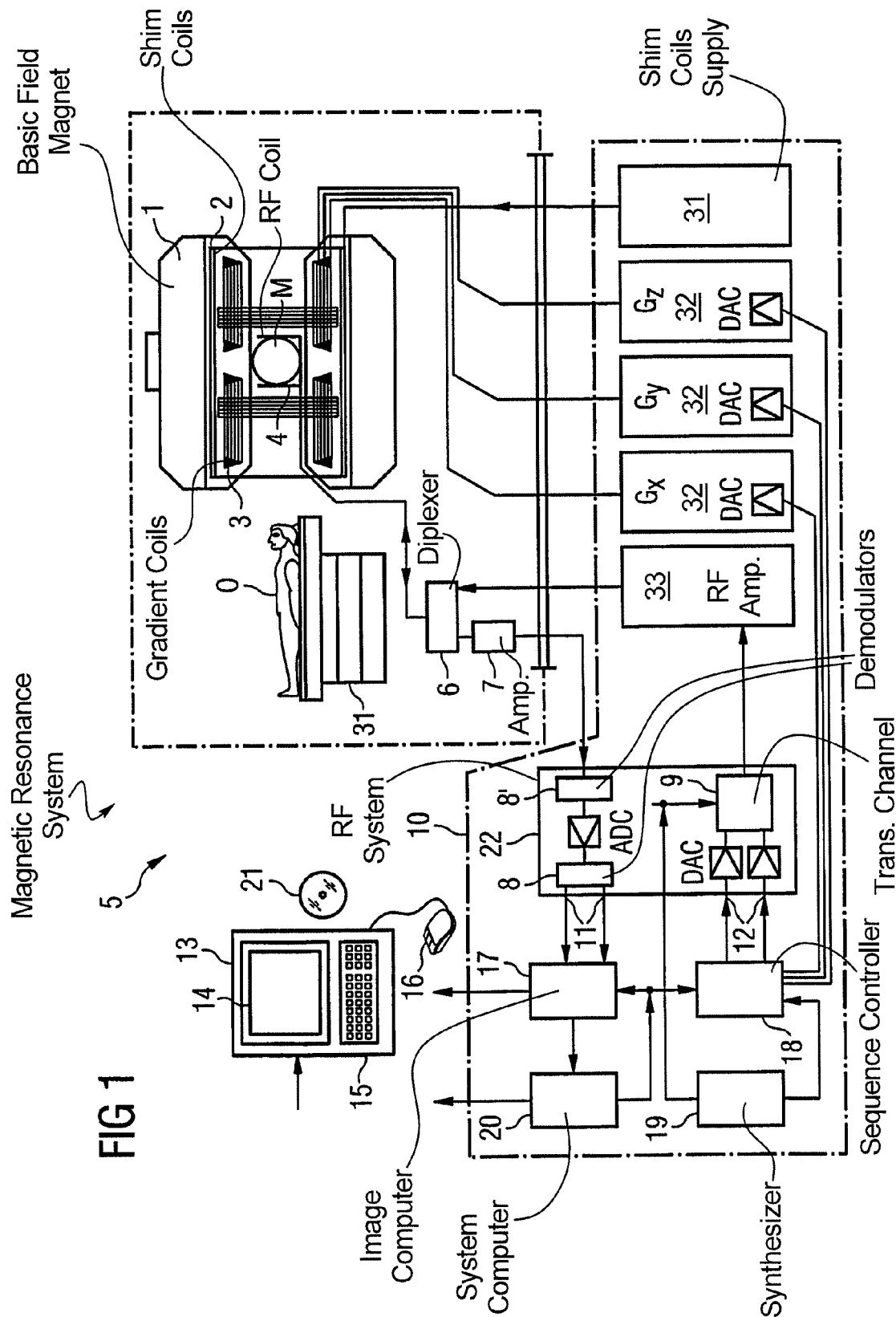
FIG. 1 schematically illustrates a magnetic resonance system according to the invention.

FIG. 1 shows a schematic presentation of a magnetic resonance system 5 (a magnetic resonance imaging or magnetic resonance tomography apparatus). A basic field magnet 1 generates a temporally constant, strong magnetic field for polarization or, respectively, alignment of the nuclear spins in an examination region of a subject, for example of a part of a human body to be examined which, lying on a table 22, is slid into the magnetic resonance system 5. The high homogeneity of the basic magnetic field that is required for nuclear magnetic resonance measurement is defined in a typical spherical measurement volume M into which the parts of the human body that are to be examined are introduced. Shim plates made of ferromagnetic material are attached at a suitable point to support the homogeneity requirements, and in particular to eliminate temporally invariable influences. Temporally variable influences are eliminated by shim coils 2 supplied with current by a shim coils supply 31.

A cylindrical gradient coil system 3 that includes three partial windings is inserted in the basic field magnet 1. Each partial winding is supplied by an amplifier 32 with current to generate a linear (also temporally modifiable) gradient field in the respective direction of the Cartesian coordinate system. The first partial winding of the gradient field system 3 generates a gradient $G_x$ in the x-direction; the second partial winding generates a gradient $G_y$ in the y-direction; and the third partial winding generates a gradient $G_z$ in the z-direction. The amplifier includes a digital/analog converter that is activated by a sequence controller for time-accurate generation of gradient pulses.

Located within the gradient field system 3 are one or more radio-frequency antennas 4 that convert the radio-frequency pulses emitted by a radio-frequency power amplifier 33 into an alternating magnetic field to excite the nuclei and align the nuclear spins of the subject to be examined or of the region of the subject to be examined. Each radio-frequency antenna 4 has one or more RF transmission coils and multiple RF reception coils in the form of an annular (advantageously linear or matrix-like) arrangement of component coils. The alternating field emanating from the precessing nuclear spins—i.e. normally the nuclear magnetic resonance echo signals caused by a pulse sequence made up of one or more radio-frequency pulses and one or more gradient pulses—is also converted by the RF reception coils of the respective radio-frequency antenna 4 into a voltage (measurement signal) which is supplied via an amplifier 7 to a radio-frequency reception channel 8 of a radio-frequency system 22. The radio-frequency system 22 furthermore has a transmission channel 9 in which the radio-frequency pulses for the excitation of the nuclear magnetic resonance are generated. The respective radio-frequency pulses are thereby digitally represented as a series of complex numbers based on a pulse sequence in the sequence controller 18 that is predetermined by the system computer 20. This number sequence is supplied as real part and imaginary part via a respective input 12 to a digital/analog converter in the radio-frequency system 22, and from this to a transmission channel 9. In the transmission channel 9 the pulse sequences are modulated on a radio-frequency carrier signal whose basic frequency corresponds to the resonance frequency of the nuclear spins in the measurement volume.

The switching over from transmission operation to reception operation takes place via a transmission/reception diplexer 6. The RF transmission coils of the radio-frequency antenna(s) 4 radiate(s) the radio-frequency pulses to excite the nuclear spins in the measurement volume M, and resulting echo signals are scanned via the RF reception coils. The correspondingly acquired magnetic resonance signals are phase-sensitively demodulated at an intermediate frequency a first demodulator 8' in the receiver of the radio-frequency system 22 and are digitized in the analog/digital converter (ADC). This signal is still demodulated to a frequency of 0. The demodulation to a frequency of 0 and the division into real part and imaginary part occur after the digitization in the digital domains in a second demodulator 8. An MR image is reconstructed by an image computer 17 from the measurement data acquired in such a manner. The administration of the measurement data, the image data and the control programs takes place via the system computer 20. The sequence controller 18 monitors the generation of the respective desired pulse sequences and the corresponding scanning of k-space based on a specification with control programs. In particular, the sequence controller 18 thereby controls the time-accurate switching of the gradients, the emission of the radio-frequency pulses with defined phase amplitude and the reception of the nuclear magnetic resonance signals. The time basis for the radio-frequency system 22 and the sequence controller 18 is provided by a synthesizer 19. The selection of corresponding control programs to generate an MR image (which control programs are stored on a DVD 21, for example) and the presentation of the generated MR image take place via a terminal 13 that has a keyboard 15, a mouse 16 and a screen 14.

FIGS. 2 and 3 have already been described in the discussion of the prior art.

In illustrations (a), (b) and (c) in FIG. 4, the specific volume 26 has an incision so that at least a portion of the inflow 24 is no longer situated within the specific volume 26. The magnetization of the blood quantity in this part of the inflow 24 thus remains protected from the inversion or saturation of the specific volume 26, such that unsaturated blood can advantageously continue to flow into the vascular tree 23 even given a low cardiac output (as this is the case according to the prior art (see FIG. 3)). The specific volume 26 includes the imaging volume 30 except for the incision.

It should be noted that, even in the embodiment shown in FIG. 4, the slice thickness 32 of the specific volume 26 is greater, at least at the points without incision, than the slice thickness of the imaging volume 30. Moreover, the imaging volume 30 is bounded perpendicular to the slice thickness 32 (for example to the right and left in FIG. 4) while the specific volume 26 actually has no boundary perpendicular to the slice thickness 32, as was already explained in the discussion of the prior art. In other words, a larger volume is inverted or saturated in all spatial directions than is then measured.

A different realization of the specific volume 26 according to the invention is shown in illustrations (a), (b) and (c) in FIG. 5. In this embodiment a slice thickness 32 of the specific volume 26 can no longer be discussed since the specific volume 26 is not slice-shaped, even with the volume to be excised. The volume 27 to be excised (in the form of a funnel or groove) can in principle extend infinitely far or can be arranged completely within the specific volume 26. In each case a portion of the inflow 24 to the vascular tree 23 is removed from the specific volume 26 by the volume 27 to be excised. Unsaturated blood thus can continue to flow into the vascular tree 23 (as in FIG. 4) after 750 ms (illustration (b) in FIG. 5) or after 1500 ms (illustration (c) in FIG. 5), respectively measured after the inversion, such that the vascular tree 23 is significantly more clearly visible in the corresponding MR angiography images than is the case according to the prior art (see illustrations (b) and (c) in FIG. 3).

Moreover, the imaging volume 30 is typically bounded (for example to the right and left in FIGS. 4 and 5) by means of frequency coding and phase coding of the MR signals while the specific volume 26 actually has no limitation perpendicular to the slice thickness 32, as was explained in the discussion of the prior art. In other words, a larger volume is inverted or saturated in all spatial directions than is then measured.

The positive influence of the present invention on the quality of the MR angiography images created according to the invention is substantiated by the following consideration. For this it is assumed that, due to the incision into the specific volume 26, a 5 cm-long segment of the aorta 29 that would be inverted or saturated according to the prior art is not inverted or saturated. This segment of the aorta 29 thus corresponds to a quantity of blood of approximately 35 ml. In patients with a pathological weakening of the heart and/or with a pathological vascular system, this 35 ml can correspond to the total quantity blood which is transported through the aorta 29 during one heartbeat.

The formation of the specific volume 26 corresponding to the embodiment type shown in FIG. 4 is explained with the aid of FIG. 6. Assuming the vascular tree 23 which is localized in an overview image, a slice-shaped initial volume 28 is defined such that this slice-shaped initial volume 28 completely contains the vascular tree. A funnel-shaped volume 27 is subsequently excised from this initial volume 28, which volume 27 at least partially contains the inflow 24 to the branch point or ostium 25. As before, the specific volume 26 that thereby results includes the vascular tree 23 but advantageously comprises just an optimally small portion of the inflow 24 at the branch point 25.

Figure 7:
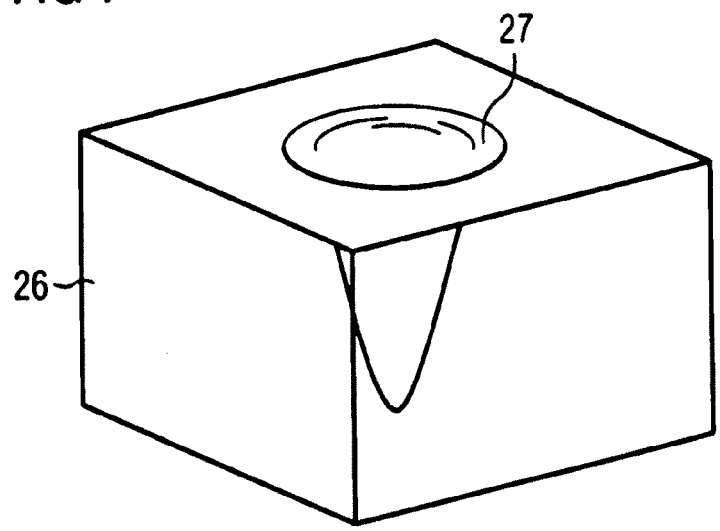
FIGS. 7 and 8 respectively show a specific volume from which a funnel-shaped or groove-shaped volume is excised.
Figure 8:
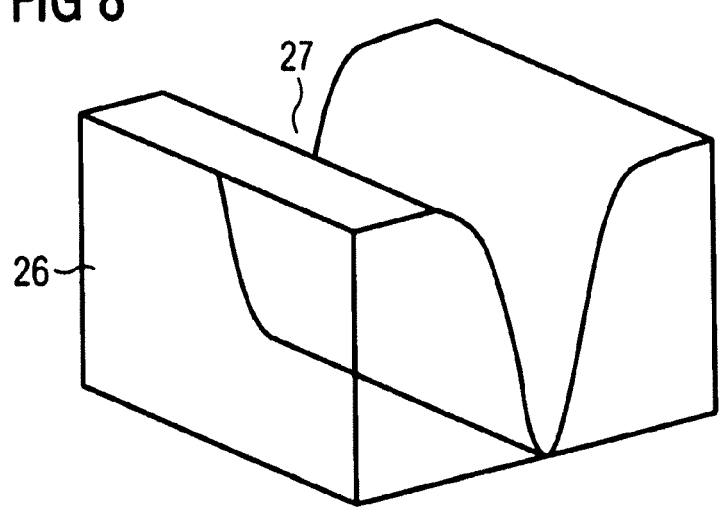

A specific volume 26 from which a funnel-shaped volume 27 is excised is presented three-dimensionally in FIG. 7. A specific volume 26 from which a groove-shaped volume 27 is excised is presented three-dimensionally in a similar manner in FIG. 8.

Figure 9:
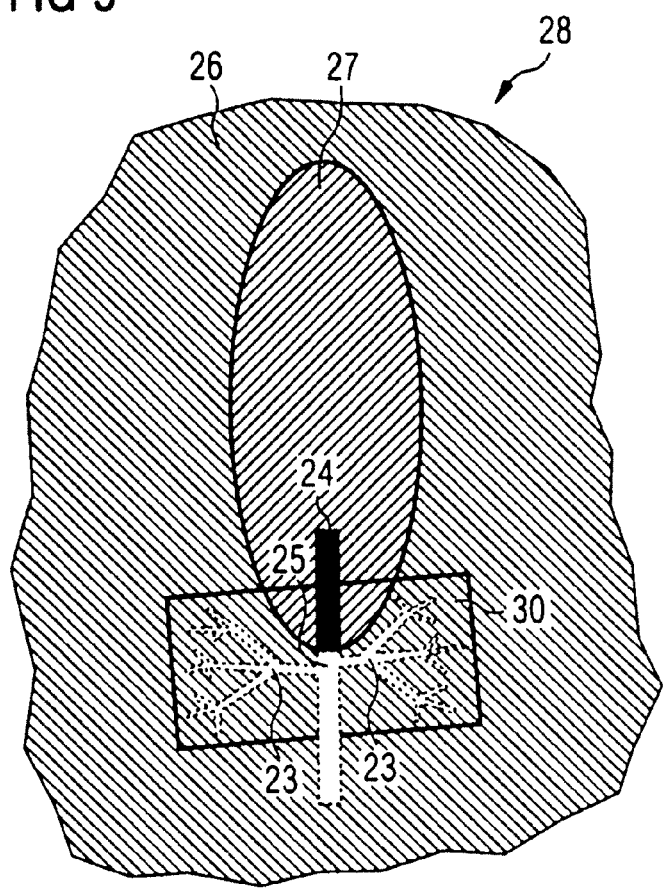
FIG. 9 shows an additional embodiment according to the invention for forming the specific volume, and embodiment for the inversion of the specific volume is also explained using FIG. 9.

The formation of the specific volume 26 according to an additional embodiment type is shown in FIG. 9. The starting point is an arbitrarily shaped initial volume 28 whose dimensions are in particular dependent on the magnetic resonance system that is used, and which comprises the imaging volume 30 and a partial segment of the inflow 24. A volume 27 to be excised or to be removed is removed from this initial volume 28. This volume 27 to be excised thereby comprises at least the partial segment of the inflow 24, in particular the partial segment of the inflow 24 except for the ostium, and optimally does not comprise the part of the imaging volume 30 of interest (i.e. in this case the vascular tree 23). The difference volume which arises from the initial volume 28 minus the volume 27 to be excised is the specific volume 26.

According to an embodiment according to the invention, the entire initial volume 28 is inverted in a first step. This inversion of the entire initial volume 28 takes place in a spatially non-selective manner, meaning that the magnetic resonance system 5 inverts the initial volume 28 depending on its properties (for example dimensions of the corresponding coils). In a second step, only the volume 27 to be excised is selectively spatially inverted. The shape of the volume 27 to be excised or, respectively, to be selectively spatially inverted can be adapted to the properties of the magnetic resonance system 5 as long as the corresponding partial segment of the inflow 24 belongs to the volume 27 to be excised and the structures 23 of interest within the imaging volume 30 are not a component of the volume 27 to be excised.

Since the initial volume 28 comprises the volume to be excised, according to this embodiment the volume to be excised is doubly inverted, whereby the magnetization of the volume 27 to be excised virtually assumes the initial state again before the first step.

In this embodiment the order of the two steps can also be exchanged, such that the volume 27 to be excised is selectively spatially inverted in the first step and the initial volume 28 is non-selectively spatially inverted in the following second step.

According to the invention, it is also possible that only the specific volume 26 is inverted or saturated in the embodiment type shown in FIG. 9.

A flow chart of a method according to the invention is shown in FIG. 10.

In Step S1 a vascular tree 23 is localized within an overview image which was acquired for a predetermined volume segment within an examination subject or a patient.

In the following Step S2, a specific volume 26 is defined which, although it optimally completely comprises the vascular tree 23, optimally does not include the inflow 24 to this vascular tree 23.

In Step S3 the spins are saturated or inverted only within the specific volume 26, and therefore optimally not in the inflow 24.

Measurement signals are acquired from the specific volume 26 a predetermined time period after Step S3, from which measurement signals MR images (in particular MR angiography images) are then created in Step S5.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating a magnetic resonance image of an imaging volume of a patient, comprising the steps of:
   operating a magnetic resonance data acquisition unit to localize an anatomical inflow structure that supplies blood to an imaging volume of a patient located in the data acquisition unit;
   for acquiring magnetic resonance diagnostic data from said imaging volume in an imaging sequence, formulating a protocol for said imaging sequence in a processor to designate a specific volume that includes said imaging volume and adapting said specific volume to said anatomical inflow structure to produce an adapted specific volume having a recess therein, by making a recess-producing, three-dimensional incision into said specific volume that removes at least a portion of said anatomical inflow structure from said specific volume;
   operating said magnetic resonance data acquisition unit to produce a modification of a magnetization of the adapted specific volume, said modification being selected from the group consisting of saturating the magnetization of the adapted specific volume and inverting the magnetization of the adapted specific volume;
   operating said magnetic resonance data acquisition unit to implement said imaging sequence according to said protocol to obtain diagnostic magnetic resonance data from said imaging volume during the modified magnetization of the adapted specific volume; and
   in an imaging computer, generating a magnetic resonance image of said imaging volume from said diagnostic magnetic resonance data.

2. A method as claimed in claim 1 wherein said anatomical inflow structure comprises a vascular tree having a branching point of a vascular segment of said vascular tree, and comprising adapting said specific volume by first designating an initial volume that includes said imaging volume, and excising an excised volume, which comprises said vascular tree up to said branching point of said vascular segment, from said initial volume.

3. A method as claimed in claim 2 comprising designating said excised volume to include said vascular tree up to said branching point of said vascular segment within said imaging volume.

4. A method as claimed in claim 2 comprising forming said excised volume with a shape selected from the group consisting of funnel-shapes and groove-shapes.

5. A method as claimed in claim 2 comprising modifying the magnetization of the adapted specific volume by inverting the magnetization of the adapted specific volume, and inverting the magnetization of the adapted specific volume as a spatially non-selected inversion that inverts the magnetization of said initial volume, combined with a spatially selective inversion that inverts the magnetization of said excised volume.

6. A method as claimed in claim 1 wherein the step of modifying the magnetization of the adapted specific volume comprises inverting the magnetization of the adapted specific volume, and inverting the magnetization of the adapted specific volume by operating said magnetic resonance data acquisition unit in said imaging sequence to radiate a radio frequency pulse into the adapted specific volume that flips nuclear spins in the adapted specific volume by 180° relative to a direction of a basic magnetic field generated in said data acquisition unit, and acquiring said magnetic resonance data from said imaging volume in an inversion time following radiation of said radio frequency pulse.

7. A method as claimed in claim 6 comprising radiating an adiabatic radio frequency pulse as said radio frequency pulse.

8. A method as claimed in claim 1 wherein the step of modifying the magnetization of the adapted specific volume comprises saturating the magnetization of the adapted specific volume, and comprising saturating the magnetization of the adapted specific volume by operating said magnetic resonance data acquisition unit to radiate a radio frequency pulse in said imaging sequence that flips nuclear spins within the adapted specific volume by 90° relative to a basic magnetic field generated in said data acquisition unit, and thereafter generating a spoiler gradient pulse that destroys a transverse magnetization of said nuclear spins in said adapted specific volume, and acquiring said magnetic resonance data from said imaging volume after said spoiler gradient pulse.

9. A method as claimed in claim 1 comprising, in said processor, automatically calculating, dependent on said adapted specific volume, a temporally varying gradient curve and a temporally varying radio frequency pulse curve by Fourier analysis, and modifying said magnetization of said adapted specific volume by operating said magnetic resonance data acquisition unit to generate said temporally varying gradient curve and said temporally varying radio frequency pulse curve in said imaging sequence, to modify the magnetization only in said adapted specific volume.

10. A method as claimed in claim 1 wherein said data acquisition unit comprises a plurality of radio frequency transmission coils, and comprising modifying the magnetization of the adapted specific volume by simultaneously radiating respective radio frequency pulses from said plurality of radio frequency transmission coils.

11. A method as claimed in claim 1 wherein said magnetic resonance data acquisition unit comprises a plurality of radio frequency transmission coils, and comprising modifying the magnetization of the adapted specific volume by radiating respective radio frequency pulses from said plurality of radio frequency transmission coils at respective points in time that are separated from each other.

12. A method as claimed in claim 1 comprising operating said magnetic resonance data acquisition unit with a pulse sequence to implement a perfusion measurement to acquire said magnetic resonance data from said imaging volume.

13. A method as claimed in claim 1 comprising generating said magnetic resonance image with a defined viewing angle by processing said magnetic resonance data with a maximum intensity projection technique.

14. A magnetic resonance apparatus for generating a magnetic resonance image of an imaging volume of a patient, comprising the steps of:
   a magnetic resonance data acquisition unit;
   a control unit configured to operate the magnetic resonance data acquisition unit to localize an anatomical inflow structure that supplies blood to an imaging volume of a patient located in the data acquisition unit;
   said control unit being configured to operate said magnetic resonance data acquisition unit to acquire magnetic resonance diagnostic data from said imaging volume in an imaging sequence, and said control unit being configured to formulate a protocol for said imaging sequence to designate a specific volume that includes said imaging volume and to adapt said specific volume to said anatomical inflow structure to produce an adapted specific volume having a recess therein, by making a recess-producing, three-dimensional incision into said specific volume that removes at least a three-dimensional portion of said anatomical inflow structure from said specific volume;

said control unit being configured to operate said magnetic resonance data acquisition unit to produce a modification of a magnetization of the adapted specific volume, said modification being selected from the group consisting of saturating the magnetization of the adapted specific volume and inverting the magnetization of the adapted specific volume;

said control unit being configured to operate said magnetic resonance data acquisition unit to implement said imaging sequence according to said protocol to obtain diagnostic magnetic resonance data from said imaging volume during the modified magnetization of the adapted specific volume; and an imaging computer configured to generate a magnetic resonance image of said imaging volume from said diagnostic magnetic resonance data.

15. A non-transitory, computer-readable storage medium encoded with programming instructions, said storage medium being loaded into a computerized control and processing system of a magnetic resonance apparatus, which comprises a magnetic resonance data acquisition unit, said programming instructions causing said computerized control and processing system to:

operate the magnetic resonance data acquisition unit to localize an anatomical inflow structure that supplies blood to an imaging volume of a patient located in the data acquisition unit;

for acquiring magnetic resonance diagnostic data from said imaging volume in an imaging sequence, formulate a protocol for said imaging sequence in a processor to designate a specific volume that includes said imaging volume and adapt said specific volume to said anatomical inflow structure to produce an adapted specific volume having a recess therein, by making a recess-producing, three-dimensional incision into said specific volume that removes at least a three-dimensional portion of said anatomical inflow structure from said specific volume;

operate said magnetic resonance data acquisition unit to produce a modification of a magnetization of the adapted specific volume, said modification being selected from the group consisting of saturating the magnetization of the adapted specific volume and inverting the magnetization of the adapted specific volume;

operate said magnetic resonance data acquisition unit to implement said imaging sequence according to said protocol to obtain diagnostic magnetic resonance data from said imaging volume during the modified magnetization of the adapted specific volume; and generate a magnetic resonance image of said imaging volume from said diagnostic magnetic resonance data.

\* \* \* \* \*